United States Patent
Juang et al.

(10) Patent No.: US 8,203,259 B2
(45) Date of Patent: Jun. 19, 2012

(54) PHOSPHOR AND LIGHT EMITTING DEVICE

(75) Inventors: Yuan-Ren Juang, Tainan (TW);
Jen-Shrong Uen, Tainan (TW);
Chih-Lung Lin, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 13/155,763

(22) Filed: Jun. 8, 2011

(65) Prior Publication Data
US 2012/0080999 A1    Apr. 5, 2012

(30) Foreign Application Priority Data
Sep. 30, 2010   (TW) ................................ 99133379 A

(51) Int. Cl.
*H01J 1/62*       (2006.01)
*C09K 11/66*      (2006.01)

(52) U.S. Cl. .. 313/484; 313/503; 313/512; 252/301.6 F; 252/301.4 F

(58) Field of Classification Search .............. 313/503, 313/484, 483, 506, 512; 252/301.6 F, 301.4 F; 423/344
See application file for complete search history.

(56) References Cited

U.S. PATENT DOCUMENTS
7,803,286 B2 *  9/2010  Sakane et al. ........... 252/301.4 F
8,076,847 B2 * 12/2011  Tamaki et al. ................ 313/512

\* cited by examiner

*Primary Examiner* — Joseph L Williams
(74) *Attorney, Agent, or Firm* — Muncy, Geissler, Olds & Lowe, PLLC

(57) ABSTRACT

The present invention provides a phosphor, including a constituent having the formula $Ca_pSr_qM_m\text{-}A_a\text{-}B_b\text{—}O_t\text{—}N_n:Eu_r$, wherein M selected from the group consisting of beryllium and zinc; A selected from the group consisting of aluminum, gallium, indium, scandium, yttrium, lanthanum, gadolinium and lutetium; B selected from a group consisting of silicon, germanium, tin, titanium, zirconium and hafnium; $0<p<1$; $0<q<1$; $0 \leq m \leq 1$; $0 \leq t \leq 0.3$; $0.00001 \leq r \leq 0.1$; $a=1$; $0.8 \leq b \leq 1.2$; and $2.7 \leq n \leq 3.1$; and the phosphor contains 20~1500 ppm of magnesium and/or 40~5000 ppm of barium. A high brightness phosphor emitting in the 600~680 nm region is achieved by means of adjusting the proportion of each of the elements of the phosphor, and in combination with controlling concentration of the magnesium and barium of the phosphor within a specific range. In addition, the present invention provides a light emitting device provided with high brilliance.

37 Claims, 3 Drawing Sheets

PHOSPHOR AND LIGHT EMITTING DEVICE

BACKGROUND OF THE INVENTION (a) Field of the Invention

The present invention relates to a nitride phosphor is used in luminescence units, such as monitors, liquid crystal back light sources, fluorescent lamps, and light-emitting diodes. The present invention further relates to compositions of the nitride phosphor and a light emitting device comprising the phosphor.

(b) Description of the Prior Art

Semiconductor-based light emitting devices have been extensively used in recent years, especially light-emitting diodes, which have already been successively developed. Because such light emitting devices are provided with the characteristics of high luminescence efficiency, small size, low power consumption and low cost than conventional light emitting apparatus such as cold cathode tubes and incandescent lamps, thus, they are applicable for use in various types of light sources. Semiconductor-based light emitting devices comprise a semiconductor light-emitting element and a phosphor, in which the phosphor absorbs and converts the light emitted from the semiconductor light-emitting element. The light emitted from the semiconductor light-emitting element and the light converted and emitted from the phosphor are mixed and utilized. Such light emitting devices are applicable for use in various areas, including fluorescent lamps, vehicles lighting, monitors, backlit liquid crystal displays, and the like. In which, white light emitting devices are the most extensively used. Current white light emitting devices are assembled by means of a YAG (yttrium aluminum garnet) phosphor ($Y_3Al_5O_{12}$:Ce) with cerium as the active center and a semiconductor light-emitting element emitting blue light. However, using the mixed light emitted from a $Y_3Al_5O_{12}$:Ce phosphor combined with a semiconductor light-emitting element emitting blue light, the color coordinates of the mixed light are positioned on the connecting line between the color coordinates of the blue light emitted from semiconductor light-emitting element and the color coordinates of the light emitted from $Y_3Al_5O_{12}$:Ce phosphor. Hence, the emitted mixed light is white light deficient in red light, and color rendering properties and color saturation are clearly insufficient. In addition, the preferred region of the excitation spectrum of the $Y_3Al_5O_{12}$:Ce and the luminescence region of the semiconductor light-emitting element are inconsistent, thereby causing poor conversion efficiency of excitation light, and a high brilliance of white light source is difficult to obtain. In order to resolve the phenomena of poor chromaticity and low luminescence brightness, YAG:Ce phosphors mixed with red light phosphors have been actively developed in recent years, and the quality of phosphors emitting red light has also been improved to increase luminescence brightness.

However, phosphors able to absorb blue light and emit red light are scarce. Current industrial research and development has primarily focused on nitride and oxynitride phosphors. Insofar as is known by the inventors, such phosphors include $Sr_2Si_5N_8$:Eu phosphors with europium (Eu) as the active center, CaAlSiN$_3$:Eu phosphors and the sialon phosphor having the general formula: $MgSi_{12-(m+n)}Al_{m+n}O_nN_{16-n}$:Eu. However, because the crystal itself has poor heat resisting properties, thus, the $Sr_2Si_5N_8$:Eu phosphor has the disadvantages of decrease in brightness and color rendering properties after long term usage. And, although the sialon phosphor itself has no durability problems, however, luminescence brightness of the phosphor is clearly insufficient, and thus not commercially popular. Although CaAlSiN$_3$:Eu phosphors have preferred durability, and provide better brightness compared to sialon phosphors, however, industries are still expecting further improvement in the luminescence brightness of the phosphor, thereby enabling the light emitting device to be provided with higher luminescence efficiency.

SUMMARY OF THE INVENTION

In light of the aforementioned problems, the objective of the present invention lies in providing high brilliance phosphor material, as well as providing a high brilliance light emitting device fabricated from the described high brilliance phosphor material together with a semiconductor light-emitting element.

Hence, in light of careful and painstaking research on the aforementioned problems, in particular, research was carried out on a novel red phosphor, research findings have enabled the inventors of the present invention to learn: adding a specific content of elements to a CaAlSiN$_3$:Eu (europium) phosphor has a remarkable effect on the luminescence brightness. And, according to research findings of the inventors, additives containing magnesium and barium provide a particularly remarkable effect on the luminescence brightness of the CaAlSiN$_3$:Eu phosphor. Thus, the most important characteristics of the present invention lie in obtaining a high brightness phosphor by adding amounts within a specific range of magnesium and barium elements, as well as forming a light emitting device by assembling the high brightness phosphor in combination with a semiconductor light-emitting element.

In order to achieve the aforementioned anticipated objective, the present invention provides a phosphor comprising a constituent having the formula—$Ca_pSr_qM_m$-$A_a$-$B_b$—$O_t$—$N_n$:Eu$_r$, in which M is selected from a group consisting of beryllium and zinc, and combinations thereof; A is selected from a group consisting of aluminum, gallium, indium, scandium, yttrium, lanthanum, gadolinium and lutetium, and combinations thereof; B is selected from a group consisting of silicon, germanium, tin, titanium, zirconium and hafnium, and combinations thereof; p, q, m, a, b, t, n, r satisfy the following relationships of $0<p<1$; $0<q<1$; $0 \leq m \leq 1$; $0.00001 \leq r \leq 0.1$; $a=1$, $0.8 \leq b \leq 1.2$; and $2.7 \leq n \leq 3.1$. Moreover, the phosphor contains 20~1500 ppm of magnesium or 40~5000 ppm of barium. Preferably, the phosphor contains 20~1500 ppm of magnesium and 40~5000 ppm of barium.

It is preferred that the aforementioned phosphor contains 85~1000 ppm of magnesium and/or 80~3000 ppm of barium.

It is preferred that $0.05 \leq p \leq 0.9$, $0.1 \leq q \leq 0.95$ in the aforementioned phosphor.

It is preferred that $0.15 \leq (p+q)<1$ in the aforementioned phosphor.

It is preferred that $(p/q)=0.1~10$ in the aforementioned phosphor.

It is preferred that each of fluorine, boron, chlorine, carbon contained in the aforementioned phosphor is less than 1000 ppm.

In the aforementioned phosphor, it is preferred that:
m=0;
A is selected from a group consisting of aluminum and gallium, and combinations thereof;
B is selected from a group consisting of silicon and germanium, and combinations thereof.

In the aforementioned phosphor, it is preferred that when a 455 nm light source is used for illumination, and the luminescence wavelength of the phosphor is 600~680 nm, then the CIE 1931 color coordinates (x, y) on the chromaticity diagram are $0.45 \leq x \leq 0.72$, $0.2 \leq y \leq 0.5$.

It is preferred that the average particle diameter in the aforementioned phosphor is above 1 μm and below than 30 μm.

A light emitting device of the present invention comprises:
a semiconductor light-emitting element for providing light in a first dominant wavelength; and the aforementioned phosphor.

The phosphor is able to receive excitation light provided from the semiconductor light-emitting element, and converts to emit light with a second dominant wavelength different to the first dominant wavelength of the excitation light produced from the semiconductor light-emitting element.

It is preferred that the semiconductor light-emitting element in the aforementioned light emitting device is able to emit light having a dominant wavelength of 300~550 nm.

The present invention primarily comprises adding a proportion of magnesium or barium elements within a specific range to obtain a high brilliance red phosphor, and after magnesium or barium elements have been added, then the phosphor obtained is provided with a relatively higher brilliance compared to the phosphor having the same chromaticity with no magnesium or barium elements added. As for the so-called the same chromaticity, it means that the difference of the color coordinates (x,y) are respectively within ±0.002. Furthermore, the present invention enables obtaining a high brilliance light emitting device by combining the phosphor with a semiconductor light-emitting element.

To enable a further understanding of said objectives and the technological methods of the invention herein, a brief description of the drawings is provided below followed by a detailed description of the preferred embodiment and Examples.

DETAILED DESCRIPTION OF THE PREFERRED EMBODIMENTS AND EXAMPLES

Figure 1:
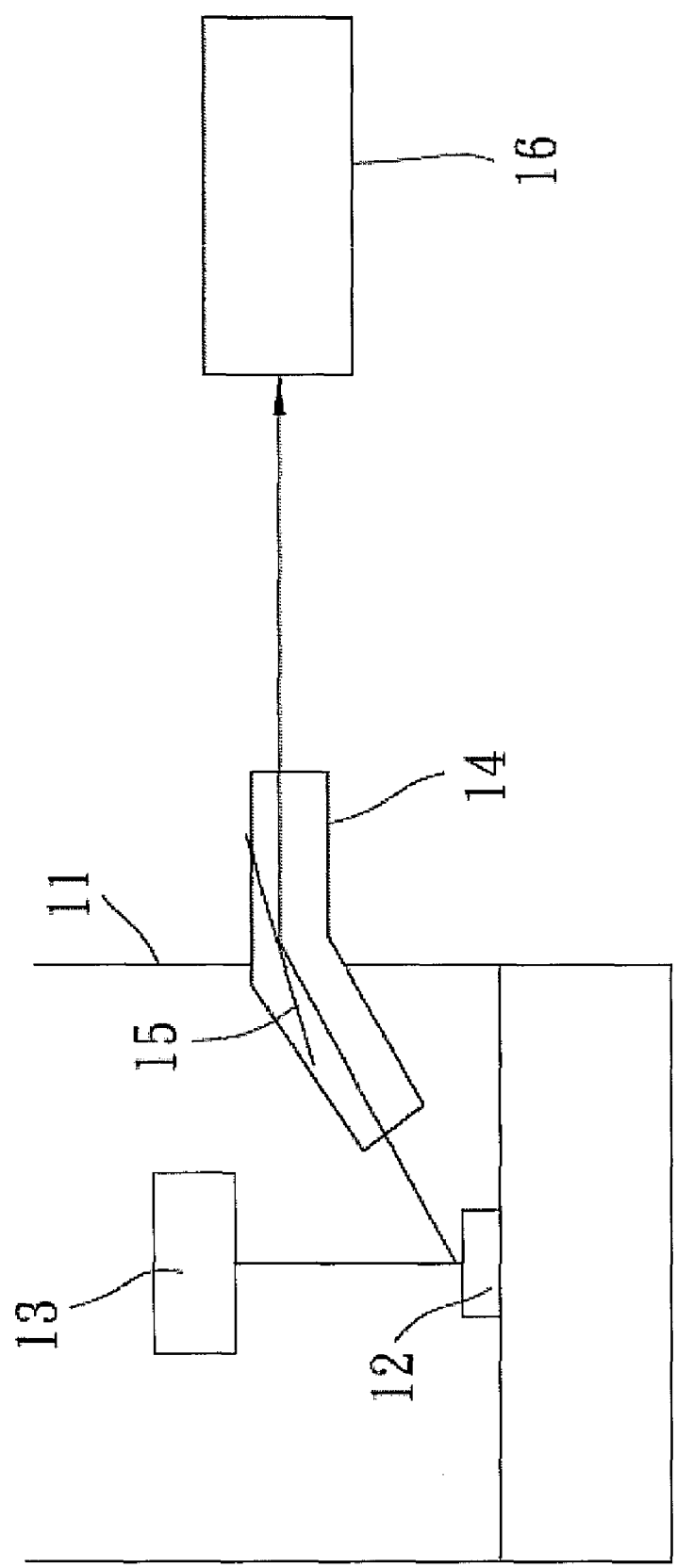
FIG. 1 is a schematic view depicting a brightness measuring device.

A phosphor of the present invention comprises a constituent having the formula: $Ca_pSr_qM_m\text{-}A_a\text{-}B_b\text{—}O_t\text{—}N_n$:$Eu_r$, in which M is selected from a group consisting of beryllium and zinc, and combinations thereof; A is selected from a group consisting of aluminum, gallium, indium, scandium, yttrium, lanthanum, gadolinium and lutetium, and combinations thereof; B is selected from a group consisting of silicon, germanium, tin, titanium, zirconium and hafnium, and combinations thereof, $0<p<1$, $0<q<1$, $0\leq m<1$, $0\leq t\leq 0.3$, $0.00001\leq r\leq 0.1$, $a=1$, $0.8\leq b\leq 1.2$, and $2.7\leq n\leq 3.1$. Moreover, the phosphor contains 20~1500 ppm of magnesium and/or 40~5000 ppm of barium. And after magnesium or barium elements have been added, then the phosphor obtained is provided with a relatively higher brilliance compared to the phosphor having the same chromaticity with no magnesium or barium elements added. As for the so-called the same chromaticity, it means that the difference of color coordinates x, y are respectively within ~0.002.

In the aforementioned formula of phosphor, A is selected from a group consisting of aluminum, gallium, indium, scandium, yttrium, lanthanum, gadolinium and lutetium, and combinations thereof. For example, A can be exclusively aluminum, and can also be a mixture of aluminum and gallium. B is selected from a group consisting of silicon, germanium, tin, titanium, zirconium and hafnium, and combinations thereof. For example, B can be exclusively silicone, and can also be a mixture of silicone and germanium. Eu is europium. Ca is calcium, Sr is strontium.

The formula of the phosphor is $Ca_pSr_qM_m\text{-}A_a\text{-}B_b\text{—}O_t\text{—}N_n$:$Eu_r$, $0<p<1$; $0<q<1$; $0\leq m<1$, in which, it is preferred that $0\leq m<1$, $0\leq m\leq 0.1$ is more preferred, and $0\leq m\leq 0.05$ is most preferred; $a=1$; more preferred is when A is aluminum, which provides better luminescence brightness; it is preferred that $0.8\leq b\leq 1.2$, $0.9\leq b\leq 1.1$ is more preferred; more preferred is when B is silicon and the value of b is 1, which provides better luminescence brightness; it is preferred that $0\leq t\leq 0.3$, and more preferred is $0\leq t\leq 0.1$; it is preferred that $2.7\leq n\leq 3.1$, and more preferred is $2.7\leq n\leq 3.0$; when m, a, b, t are within the aforementioned ranges, then better luminescence brightness is provided; it is preferred that $0.00001\leq r\leq 0.1$ when the value of r is smaller than 0.00001, the quantity of Eu of the luminescent center is few, thus, luminescence brightness is reduced; when the value of r is greater than 0.1, a reduction in brightness occurs because of Eu interatomic mutual interference. More preferred is when the value of r is 0.002~0.03, which provides better luminescence brightness.

In addition, the composition of the phosphor of the present invention at the same time contains calcium and strontium elements. In which $0<p<1$ and $0<q<1$, the preferred value of p is 0.02~0.95, while the preferred value of q is 0.05~0.98; more preferred values are $p=0.05\sim 0.9$ and $q=0.1\sim 0.95$. Regarding the relative relationship of the calcium and strontium elements, it is preferred that $0<(p+q)<1$ and $(p/q)=0.1\sim 10$; more preferred values are $0.15\leq (p+q)<1$ and $(p/q)=0.1\sim 9$. More particularly, in view of the phosphor of the present invention, when the phosphor with calcium and strontium elements comprises 20~1500 ppm of magnesium and/or 40~5000 ppm of barium, then luminescence brightness is increased. Although the inventors of the present invention are unable to ascertain the reason for the increase in brightness, the present invention is not limited by the following theory.

However, the inventor infers that a solid solution jointly formed from a substitute by the strontium elements and remained calcium elements expands the volume of the crystal lattice, which, compared to the phosphor containing only calcium elements, is provided with weak crystal field energy, thus, causing a blue shift effect on the luminescence wavelength. In addition, the phosphor of the present invention contains 20~1500 ppm of magnesium and/or 40~5000 ppm of barium, thus, the inventor of the present invention infers that because of the existence of the magnesium elements and/or barium elements, the originally distorted pentacoordinate structure formed from luminescent center and nitrogen elements is restored to its original symmetry, thereby enabling the luminescent center to effectively transmit energy, and luminescence brightness is higher than red phosphors of the prior art.

When 455 nm light source is used to illuminate the phosphor of the present invention, the phosphor is excited to emit visible light and the dominant wavelength of the emitted visible light is 600~680 nm. The color coordinates (x,y) of the emitted light base on the CIE 1931 chromaticity diagram are $0.45\leq x\leq 0.72$, $0.2\leq y\leq 0.5$. The dominant wavelength of the emitted light refers to a wavelength of the greatest luminescence intensity in the luminescence spectrum.

In one of the examples of the phosphor of the present invention, $0<p<1$, $0<q<1$, $0\leq m\leq 0.05$, $0\leq t\leq 0.3$, $0.00001 \leq r \leq 0.1$, $p+q+m+r=[1/(1+t)]$, $a=1$, $b=(1-t)/(1+t)$, $n=(3-t)/(1+t)$; and the phosphor contains 20~1500 ppm of magnesium and/or 40~5000 ppm of barium. Taking luminescence brightness into consideration, the preferred composition of the phosphor is provided with $Ca_pSr_qM_m\text{-}A_a\text{-}B_b\text{—}O_t\text{—}N_n\text{:}Eu_r$ having the same crystal structure as $CaAlSiN_3$, and exists in single phase. However, the synthesis process is affected by factors including proportion of raw materials, addition of flux, impurities in the raw materials, contamination during the processing procedure and volatilization of the raw materials. In addition, it is possibly composed of a single phase but it may be composed of a mixture thereof with the other crystal phases or an amorphous phase. As long as under the prerequisite that the luminescence brightness is not affected, then the aforementioned situation is still in the scope of present invention.

It is desirable that content of the phosphor having the same crystallization phase as $CaAlSiN_3$ crystal structure, and the content can be more than 30% of the total mass of the phosphor in order to obtain high brightness, however, more than 60% is preferred, and more than 90% is the optimum preference. During practical implementation, an X-ray powder diffraction spectrum can be used to confirm the phosphor contains the same crystal structure as $CaAlSiN_3$, and compare the strongest peaks of the X-ray powder diffraction spectrum with the strongest peaks of other crystal phases to determine the respective proportion of the content of the phosphor.

Results from constituent analysis of the examples of the aforementioned phosphor have found a slight deviation in the values calculated for m, a, b, t, n for each of the elements compared to the calculated values for m, a, b, t, n of raw materials. This phenomenon can be thought to occur during firing, when a small quantity of the raw materials decompose or evaporate or do not enter the crystal lattice and are washed away, or results from analytical errors. In particular, deviation in the value for t, which can be thought to occur because the raw materials from the beginning contain oxygen, or oxygen adheres to the surfaces, or when weighing the raw materials, and when mixing and firing, causing surface oxidization of the raw materials, thus, oxygen mixed into the raw materials, and, after firing, the moisture or oxygen is absorbed into the surface of the phosphor. In addition, when firing is carried out in an environment containing nitrogen and/or ammonia, the oxygen contained in the raw materials might possibly separate therefrom and be replaced by the nitrogen, and thus the deviations in t, n value will occur. The manufacture of the phosphor of the present invention, raw materials of M (+II valence), A (+III valence), B (+IV valence) may be respectively selected from nitride compounds, oxide compounds, or any form of compound or metal. For example, a mixture of M element nitride ($M_3N_2$)/oxide compound (MO) or an A element and B element nitride (AN, $B_3N_4$). The so-called oxide compounds are not only limited to oxygen contained compounds. Other compounds, such as carbonates and oxalates, will decompose during firing, and compounds containing the respective element and oxygen also belong to the aforementioned range of "oxide compounds". As for nitrides, this refers to compounds provided with the respective element and nitrogen.

In addition, because the quantities of magnesium and barium in phosphor affects the luminescence brightness, thus, the magnesium and barium contents must be controlled to be within a specific range to achieve high luminescence brightness. The phosphor of the present invention contains 20~1500 ppm of magnesium and/or 40~5000 ppm of barium, with 85~1000 ppm of magnesium and 80~3000 ppm of barium being preferred. When the magnesium content is greater than 1500 ppm and/or the barium content is greater than 5000 ppm, then the luminescence brightness of the phosphor decreases. When the quantities of magnesium and barium are less than 20 ppm and 40 ppm respectively, then there is no increase effectiveness in the brightness.

In order to achieve the content range of magnesium and/or barium of the present invention, it is preferred to carry out by an external addition method before firing. There is no particular limit on the added precursors of magnesium and/or barium, and in the various types can include magnesium metal, barium metal, magnesium carbonate, barium carbonate, magnesium nitride, barium nitride, magnesium oxide, barium oxide, magnesium hydroxide, barium hydroxide, magnesium hydride and barium hydride. In which, pure magnesium metal, pure barium metal, magnesium nitride, barium nitride provides the preferred effect.

In the composition of the phosphor of the present invention, zinc is preferred for M, aluminum is preferred for A, silicon is preferred for B, and Eu is the europium. The dominant wavelength of the visible light emitted from the phosphor is 600 nm~680 nm, and the phosphor is provided with an excitation wavelength of 250 nm~550 nm. When a 455 nm light source is used to illuminate the phosphor of the present invention, then the color coordinates (x,y) of the emitted light base on CIE 1931 chromaticity diagram are $x=0, 45$~$0.72$, $y=0.2$~$0.5$, respectively. The phosphor of the present invention containing the specific amount of magnesium and/or barium has a higher brightness compared to a phosphor with the same chromaticity but not containing magnesium and/or barium. As for the so-called same chromaticity, it means that the differences of the color coordinates (x,y) are respectively within ±0.002.

The raw materials for the phosphor of the present invention can be various different forms of precursors, and for the purpose of convenience, a description of an implementation method using nitride raw material is provided hereinafter. Although the raw material of various nitrides of M, A, and B are commercially available, however, because the higher the purity the better the results, thus, prepare 3N (99.9%) and above of raw material for optimum results. From the viewpoint of promoting a reaction, it is preferred that the particles of each raw material is minute size. However, due to different particle sizes and shapes of raw material, thus, the particle sizes and shapes of the phosphor obtained will be different. Hence, all that is needed is to prepare nitride compounds of approximately the same size as those of the final particle sizes required for the phosphor. The raw material of Eu from commercially available oxide compounds, nitride raw material or metal is preferred. And the higher the purity the better the results, thus, 2N and above is preferred, more particularly, raw material of 3N and above is the most preferred.

Mixing methods of the raw materials can use dry methods and wet methods, which include a variety of implementation methods such as dry ball grinding methods or wet ball grinding methods and is not limited to a particular method. When weighing out and mixing $Ca_3N_2$, $Sr_3N_2$, these compounds are easily oxidized, thus, it is more appropriate to carry out within an inactive atmosphere of a glove box. Moreover, because the nitrides of each of the raw material are easily affected by moisture, thus, it is best to use inactive gases that the moisture content has been thoroughly removed. In addition, if pure water is used as a solvent of wet mixing method, then the raw materials will be decomposed, thus, appropriate organic solvents must be chosen. The mixing device can be selected from a conventional ball grinder or a mortar.

When preparing the phosphor, each of the raw materials is mixed according to a specified weighing proportion, placed into a crucible, and the crucible together with the raw materials placed into a high temperature furnace for firing. When firing, the firing temperature is carried out at a high temperature, thus, it is preferred that the furnace uses a metal resistor resistive heating type or a graphite resistor resistive heating type. It is preferred that the firing method uses no external mechanical pressure firing methods such as normal pressure firing methods or a gas pressure (using gas compression) firing methods. It is preferred that the crucible is made from high-purity material that does not contain impurities, including crucibles that can be used in an inactive environment, such as a $Al_2O_3$ crucible, $Si_3N_4$ crucible, AlN crucible, sialon crucible and a BN (boron nitride) crucible. However, it is preferred that a BN crucible is used to prevent the mixing in of impurities originating from the crucible. The firing atmosphere is nonoxidizing gas, such as nitrogen, hydrogen, ammonia, argon, or a combination of any of the aforementioned gases. Firing temperature of the phosphor is above 1200° C. and below 2200° C., more preferred is a temperature of above 1400° C. and below 2000° C.; heating rate is 3~15° C./min. Firing carried out at a relatively low temperature enables obtaining a relatively tiny particle size of phosphor, while firing carried out at a relatively high temperature enables obtaining a phosphor of relatively large particle size. The firing time differs according to the types of raw materials used, but in general, a reaction time of 1~12 hours is preferred. Regarding the pressure during firing in an inactive environment, it is preferred that firing is carried out below 0.5 Mpa (below 0.1 MPa is especially preferred). After firing is completed, it is cooled to room temperature, and ball grinding, or an industrial pulverizer can be used to pulverize the fired compound, after which washing, filtration, drying and grading steps are carried out, thereby obtaining the phosphor of the present invention.

In order to obtain a high brightness phosphor, during firing, the effect of factors such as addition of flux, impurities in the raw materials and contamination during the processing procedure, the amount of impurities contained in the described phosphor should be as little as possible. In particular, the presence of large amounts of elements such as fluorine elements, boron elements, chlorine elements and carbon elements will suppress luminescence. Hence, high-purity raw materials are chosen, and the synthesis steps are controlled to prevent contamination, thereby the aforementioned elements of fluorine, boron, chlorine, carbon are respectively less than 1000 ppm.

When the phosphor of the present invention is used in powder form, then it is preferred that the average particle diameter of the phosphor powder is below 30 μm. The reason for which is because the light is primarily emitted from the surfaces of the phosphor powder. If the average particle diameter is below 30 μm (in the present invention, so-called "average particle diameter" refers to the median value $D_{50}$ of the volume-related particle distribution, it means 50% of the particles of the distribution are smaller and 50% are larger than the median value), thereby corresponding the surface area of each unit weight of the powder to a desired value, and thus preventing reduction in brightness. In addition, under circumstances whereby the powder is coated on a light-emitting element, then density of the powder can be increased, thereby also preventing reduction in brightness. Moreover, according to a research was carried out by the inventors, it is known that the preferred average particle diameter is larger than 1 μm from the viewpoint of the luminescence efficiency of the phosphor powder: According to that described above, it is preferred that the average particle diameter of the phosphor powder of the present invention is above 1 μm and below 30 μm, more particularly, optimum preference is particle diameters of above 3.0 μm and below 20 μm. As for the so-called "average particle diameter ($D_{50}$)", a Multisizer-3 manufactured by Beckman Coulter Company is used to measure the value by means of the Coulter Counter.

The phosphor of the present invention is applicable for use in vacuum fluorescent display (VFD), field emission display (FED), plasma display panel (PDP), cathode ray tube (CRT), light-emitting diode (LED), and the like. In particular, when a 455 nm light source is used to illuminate the phosphor of the present invention, the dominant wavelength of the emitted visible light is 600~680 nm, and the color coordinates (x,y) of the emitted visible light base on CI 1931 chromaticity diagram are $0.45 \leq x \leq 0.72$, $0.2 \leq y \leq 0.5$; moreover, luminescence brightness is high, and is thus especially suitable for use in light-emitting diodes.

A light-emitting device of the present invention comprises a semiconductor light-emitting element and the phosphor of the present invention. A semiconductor light-emitting element providing light of wavelength 300~550 nm is preferred, more particularly, an ultraviolet (or violet) semiconductor light-emitting element emitting light of wavelength 330~420 nm or blue light semiconductor light-emitting element emitting light of wavelength 420~500 nm are more preferred. As for the light-emitting element, the semiconductor light-emitting element can be various types of semiconductors, including zinc sulfide or gallium nitride semiconductor light-emitting elements. And regarding the luminescence efficiency, a gallium nitride semiconductor is preferred. The gallium nitride light-emitting element can be manufactured by Metal Organic Chemical Gaseous Phase Deposition (MOCVD) or Hydride Vapor Phase Epitaxy (HYPE) on a baseplate to form a nitride semiconductor. The semiconductor light-emitting element formed from $In_\alpha Al_\beta Ga_{1-\alpha-\beta}N$ ($0 \leq \alpha, 0 \leq \beta, \alpha+\beta<1$) is the optimum preference. The semiconductor structure can be an isotropic structure, including MIS (metal-insulator semiconductor) junctions, PIN junctions, PN junctions, and the like, heterojunction structures or double heterojunction structures. In addition, material of the semiconductor layer or degree of mixed crystals can be modified to adjust the wavelength of the provided light.

In addition to exclusively comprising the phosphor, the light emitting device of the present invention can also be used together with phosphors provided with other light emitting characteristics to fabricate a light emitting device that is able to emit the required color. For example, using a ultraviolet semiconductor light-emitting element and providing light with wavelength of 330~420 nm as a excited light source, and a blue light phosphor excited by these wavelengths to emit wavelengths of above 420 nm and below 500 nm, and a green light phosphor excited to provide light with wavelengths above 500 nm and below 570 nm, which can be assembled with the phosphor of the present invention. An example of the aforementioned blue light phosphor can be $BaMgAl_{10}O_{17}$:Eu, the green phosphor can be a β-Sialon phosphor. Based on aforementioned, when ultraviolet rays emitted from the semiconductor light-emitting element illuminates the phosphor, red, green, blue tricolored light is emitted, which forms a white light light-emitting device.

In addition, a blue semiconductor light-emitting element for providing light with wavelength of 420~500 nm can also be used as a excited light source, and a yellow phosphor excited by these wavelengths to emit wavelengths of above 550 nm and below 600 nm, which can be assembled with the phosphor of the present invention. An example of the aforementioned yellow phosphor is $Y_3Al_5O_{12}$:Ce. Based on aforementioned, when blue light emitted from the semiconductor light-emitting element illuminates the phosphor, red and yellow bicolored light is emitted, which is mixed with the blue light emitted from the semiconductor light-emitting element to form a white light or light bulb color illuminating appliance.

Furthermore, using a blue semiconductor light-emitting element for providing light with wavelength of 420~500 nm as a excited light source, and a green phosphor excited by these wavelengths to emit wavelengths of above 500 nm and below 570 nm, which can be assembled with the phosphor of the present invention. Such a green phosphor can be a β-Sialon phosphor. Based on aforementioned, when blue light emitted from the semiconductor light-emitting element illuminates the phosphor, red and green bicolored light is emitted, which is mixed with the blue light emitted from the semiconductor light-emitting element to form a white light illuminating appliance.

EXAMPLES AND COMPARATIVE EXAMPLES

The following provides descriptions of the Examples and Comparative Examples of the present invention; however, the present invention is not limited to such Examples.
Description of the Measuring Method and Raw Material Sources:

(1) Brightness and color coordinates of the phosphor: light with wavelengths of 455 nm were used to illuminate the phosphor and measurements were carried out by means of a brightness meter—TOPCON SR-3A. Measurement inaccuracy in brightness values were within ±0.3%.

(2) Dominant wavelength of the light emitted from the phosphor: measurements were carried out by means of a Jobin YVON Fluoro Max-3. Dominant wavelength of the emitted light refers to the wavelength of the largest luminous intensity when using 455 nm light to excite the phosphor.

(3) Analysis of the elemental composition of the phosphor:

(3-1a) Apparatus: measurements were carried out by means of a Jobin YVON ULTIMA-2, inductively coupled plasma atomic emission spectrometer (ICP).

(3-1b) Sample Preprocessing: accurately weigh out 0.1 g of samples, and add in a platinum crucible and then mix evenly with 1 g of $Na_2CO_3$, after which the mixture was fused in a high temperature furnace at 1200° C. (temperature conditions: temperature rises from room temperature to 1200° C. in 2 hours, and then the temperature is maintained for 5 hours). After the mixture has cooled down, add acid solution such as 25 ml of HCl (hydrochloric acid) (36%), and then heat the fuse on a hot plate at 300° C. until clarified. After cooling, place in a 100 ml PFA volumetric flask and add a definite quantity of pure water to a gage mark.

(3-2a) Apparatus: Horiba nitrogen-oxygen analyzer. Model: EMGA-620W.

(3-2b) Measurements: 20 mg of the phosphor was placed into a tin capsule, and then disposed in a crucible for measurements.

(4) $D_{50}$ average particle diameter analysis of the phosphor: measurements were carried out by means of a Beckman Coulter Multisizer-3. In the experiment, $D_{50}$ represents median value of the volume-related particle distribution, it means 50% of the particles of the distribution are smaller and 50% are larger than the median value.

Example of Synthesis 1

Prepare the required calcium metal (3N7), strontium metal (4N), magnesium metal (2N) and barium metal (2N), and after pulverizing, respectively place and fire in a pure nitrogen atmosphere to form nitride compounds. Reaction conditions are firing for 24 hours at 750° C., 700° C., 600° C., 700° C. respectively, thereby obtaining calcium nitride ($Ca_3N_2$), strontium nitride ($Sr_3N_2$), magnesium nitride ($Mg_3N_2$) and barium nitride ($Ba_3N_2$) compounds respectively.

Example 1

Figure 3:
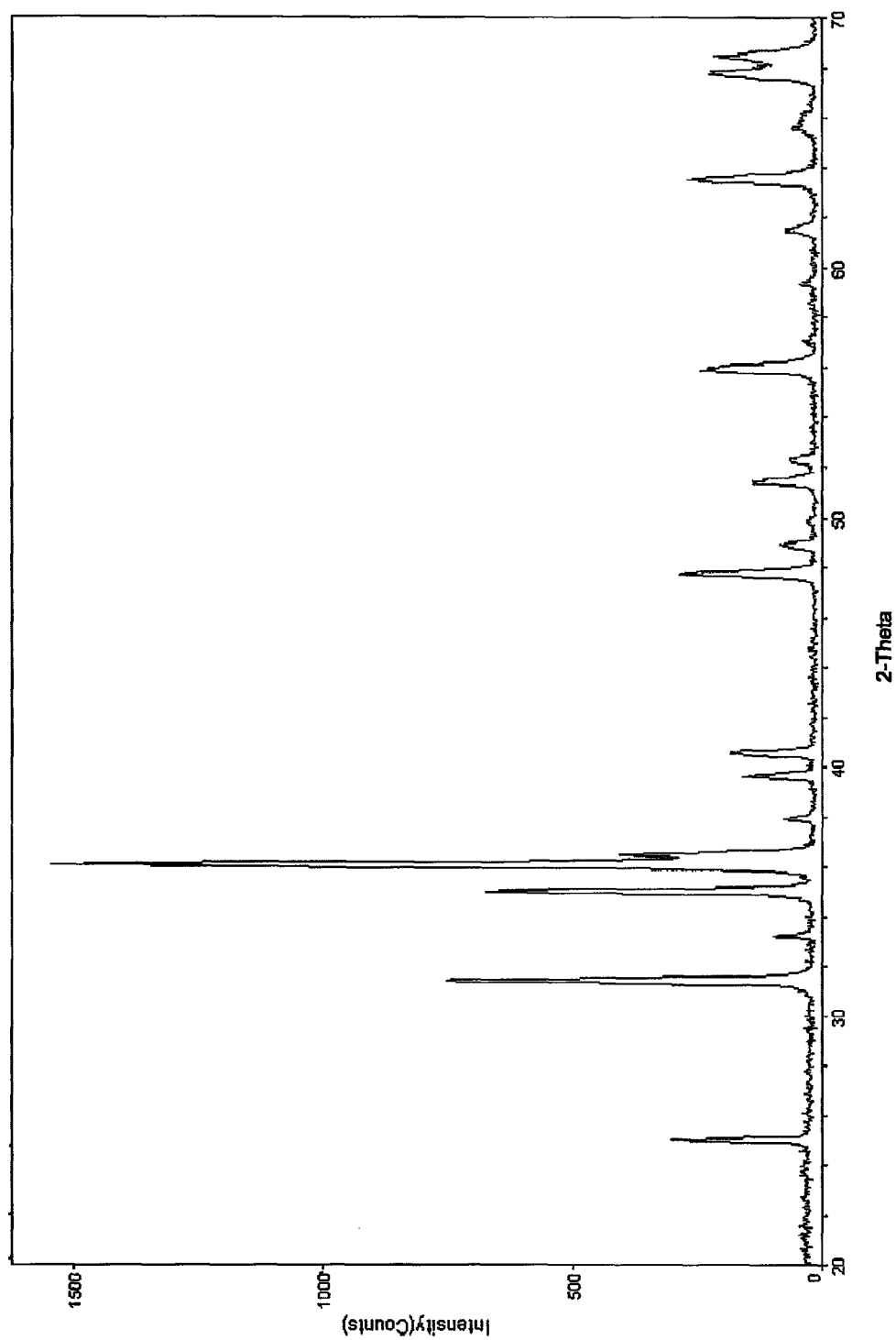
FIG. 3 is a powder diffraction graph (XRD, X-Ray Diffraction) of an embodiment of the Example 1 of the present invention.

Prepare the synthesized $Ca_3N_2$, $Sr_3N_2$, $Mg_3N_2$ from Example of Synthesis 1 and AlN(3N), $Si_3N_4$(3N), $Eu_2O_3$ (4N). Weigh out each raw material powder according to the proportion 0.445/3 moles of $Ca_3N_2$, 0.542/3 moles of $Sr_3N_2$, 0.005/3 moles of $Mg_3N_2$, 1 mole of AlN, ⅓ mole of $Si_3N_4$, and 0.008/2 moles of $Eu_2O_3$. Then use a mortar to mix the compounds in a glove box with a nitrogen environment. See Table 1 for the mole proportions of each element in the mixed raw material powder. The aforementioned mixed raw material powder is placed into a boron nitride crucible, and the crucible is placed into a high temperature furnace. The atmosphere inside the furnace is a high purity nitrogen environment, and the gas flow rate is 80 liters/minute. The temperature is raised to 1500° C. based on a heating rate of 10° C./minute, whereupon the temperature is maintained at 1500° C. for 12 hours. The temperature is then decreased to room temperature based on a cooling rate of 10° C./minute, whereupon pulverizing, ball grinding, washing two times, filtration, drying, and grading steps are respectively carried out, thereby obtaining the phosphor of the present invention. Results from the nitrogen-oxygen analyzer and ICP analysis are Ca: 10.83% by weight, Sr: 28.88% by weight, Al: 16.43% by weight, Si: 17.08% by weight, Eu: 0.73% by weight, N: 23.77% by weight, O: 2.1% by weight. After analysis, the formula obtained for the phosphor is $Ca_{0.4438}Sr_{0.5413}Al_1Si_{0.9987}N_{2.7869}O_{0.2155}:Eu_{0.0079}$, that is, in the formula $Ca_pSr_qM_m\text{-}A_a\text{-}B_b\text{-}O_t\text{-}N_n:Eu_r$, p=0.4438, q=0.5413, m=0, t=0.2155, r=0.0079, a=1, b=0.9987, and n=2.7869. Average particle diameter ($D_{50}$) of the phosphor is 4.75 µm, magnesium content is 76 ppm, barium content is 25 ppm, boron content is 93 ppm and carbon content is 251 ppm. FIG. 3 is an X-ray powder diffraction graph (XRD). Test results of the properties of the phosphor are listed in Table 1-A, in which luminescence brightness refers to taking the luminescence brightness of Comparative Example 1 as comparative 100% luminescence brightness. The luminescence brightness in the following Tables 2-A~6-A are proceeded in the same manner as described above.

Examples 2~5 and Comparative Example 1

Adjustment of mole proportions of each of the elements of the mixed raw material powder are as depicted in Table 1, the remaining steps are the same as for Example 1, and the remaining test results for the properties are listed in Table 1-A. From Table 1-A, it can be understood that under circumstances whereby the phosphor has the same chromaticity, contains calcium and strontium, and has content of magnesium and/or barium within the specified range of the present invention, then the luminescence brightness of the phosphor is higher than the phosphor with a content of magnesium and/or barium outside the specified range of the present invention. Maximum difference in brightness of phosphors of Examples and Comparative Example can reach 8%. The source of the barium elements in Tables 1~6 are the barium nitride ($Ba_3N_2$) from the Example of Synthesis 1.

Examples 6~8 and Comparative Example 2

Adjustment of mole proportions of each of the elements of the raw material are as depicted in Table 2, sintering temperature is changed to 1800° C., and the remaining steps are the same as for Example 1. From Table 2-A, it can be understood that from the test results of properties that the luminescence brightness of the phosphor containing calcium and strontium, and having content of magnesium and/or barium within the specified range of the present invention is higher than the phosphor with a content of magnesium and/or barium outside the specified range of the present invention.

Example 9 and Comparative Example 3

Adjustment of mole proportions of each of the elements of the mixed raw material powder are as depicted in Table 3, the remaining steps are the same as for Example 1. From Table 3-A, it can be understood that from the test results of properties that the luminescence brightness of the phosphor containing calcium and strontium, and having content of magnesium and/or barium within the specified range of the present invention is higher than the phosphor with a content of magnesium and/or barium outside the specified range of the present invention.

Examples 10~11 and Comparative Examples 4~7

Adjustment of mole proportions of each of the elements of the mixed raw material powder are as depicted in Table 4, sintering temperature is changed to 1800° C., in Example 11 and Comparative Examples 6~7 EuN is used instead of $Eu_2O_3$, and the remaining steps are the same as for Example 1. From Table 4-A, it can be understood that from the test results of properties that the luminescence brightness of the phosphor containing calcium and strontium, and having content of magnesium and/or barium within the specified range of the present invention is higher than the phosphor with a content of magnesium and/or barium outside the specified range of the present invention.

Comparative Examples 8~9

Adjustment of mole proportions of each of the elements of the mixed raw material powder are as depicted in Table 5, sintering temperature in Comparative Example 9 is changed to 1800° C., and the remaining steps are the same as for Example 1. From Table 5-A, it can be understood that from the test results of properties that the content of the magnesium or barium of the phosphor is within the specified range of the present invention, however in comparative example 8 that does not contain strontium nitride and Comparative Example 9 that does not contain calcium nitride, hence there is an obvious decrease in the luminescence brightness of the phosphor.

Examples 12~14 and Comparative Examples 10~11

Adjustment of mole proportions of each of the elements of the mixed raw material powder are as depicted in Table 6, in which $Y_2O_3$(3N) is used for the Y element, $GeO_2$(3N) is used for the Ge element, and ZnO(3N) is used for the Zn element. The remaining steps are the same as for Example 1. The results of the experiment tests are depicted in Table 6-A.

TABLE 1

|  | Ca | Sr | Mg | Ba | Al | Si | O | N | Eu |
|---|---|---|---|---|---|---|---|---|---|
| Comparative Example 1 | 0.45 | 0.542 | 0 | 0 | 1 | 1 | 0.012 | 2.995 | 0.008 |
| Example 1 | 0.445 | 0.542 | 0.005 | 0 | 1 | 1 | 0.012 | 2.995 | 0.008 |
| Example 2 | 0.44 | 0.542 | 0.01 | 0 | 1 | 1 | 0.012 | 2.995 | 0.008 |
| Example 3 | 0.44 | 0.542 | 0 | 0.01 | 1 | 1 | 0.012 | 2.995 | 0.008 |
| Example 4 | 0.41 | 0.542 | 0.01 | 0.03 | 1 | 1 | 0.012 | 2.995 | 0.008 |
| Example 5 | 0.43 | 0.542 | 0.02 | 0 | 1 | 1 | 0.012 | 2.995 | 0.008 |

TABLE 2

|  | Ca | Sr | Mg | Ba | Al | Si | O | N | Eu |
|---|---|---|---|---|---|---|---|---|---|
| Comparative Example 2 | 0.2 | 0.792 | 0 | 0 | 1 | 1 | 0.012 | 2.995 | 0.008 |
| Example 6 | 0.17 | 0.792 | 0.03 | 0 | 1 | 1 | 0.012 | 2.995 | 0.008 |
| Example 7 | 0.16 | 0.792 | 0 | 0.04 | 1 | 1 | 0.012 | 2.995 | 0.008 |
| Example 8 | 0.14 | 0.792 | 0.04 | 0.02 | 1 | 1 | 0.012 | 2.995 | 0.008 |

TABLE 3

|  | Ca | Sr | Mg | Ba | Al | Si | O | N | Eu |
|---|---|---|---|---|---|---|---|---|---|
| Comparative Example 3 | 0.75 | 0.242 | 0 | 0 | 1 | 1 | 0.012 | 2.995 | 0.008 |
| Example 9 | 0.65 | 0.242 | 0.05 | 0.05 | 1 | 1 | 0.012 | 2.995 | 0.008 |

TABLE 4

|  | Ca | Sr | Mg | Ba | Al | Si | O | N | Eu |
|---|---|---|---|---|---|---|---|---|---|
| Comparative Example 4 | 0.05 | 0.792 | 0.15 | 0 | 1 | 1 | 0.012 | 2.995 | 0.008 |
| Comparative Example 5 | 0.13 | 0.862 | 0 | 0 | 1 | 1 | 0.012 | 2.995 | 0.008 |
| Example 10 | 0.07 | 0.862 | 0.06 | 0 | 1 | 1 | 0.012 | 2.995 | 0.008 |
| Comparative Example 6 | 0.05 | 0.792 | 0 | 0.15 | 1 | 1 | 0 | 3.003 | 0.008 |
| Comparative Example 7 | 0.11 | 0.882 | 0 | 0 | 1 | 1 | 0 | 3.003 | 0.008 |
| Example 11 | 0.105 | 0.882 | 0 | 0.005 | 1 | 1 | 0 | 3.003 | 0.008 |

TABLE 5

|  | Ca | Sr | Mg | Ba | Al | Si | O | N | Eu |
|---|---|---|---|---|---|---|---|---|---|
| Comparative Example 8 | 0.987 | 0 | 0.005 | 0 | 1 | 1 | 0.012 | 2.995 | 0.008 |
| Comparative Example 9 | 0 | 0.987 | 0 | 0.005 | 1 | 1 | 0.012 | 2.995 | 0.008 |

TABLE 6

|  | Ca | Sr | Mg | Ba | Zn | Al | Y | Si | Ge | O | N | Eu |
|---|---|---|---|---|---|---|---|---|---|---|---|---|
| Comparative Example 10 | 0.45 | 0.542 | 0 | 0 | 0 | 0.998 | 0.002 | 1 | 0 | 0.015 | 2.993 | 0.008 |
| Example 12 | 0.445 | 0.542 | 0.005 | 0 | 0 | 0.998 | 0.002 | 1 | 0 | 0.015 | 2.993 | 0.008 |
| Comparative Example 11 | 0.45 | 0.542 | 0 | 0 | 0 | 1 | 0 | 0.998 | 0.002 | 0.016 | 2.992 | 0.008 |

TABLE 6-continued

|  | Ca | Sr | Mg | Ba | Zn | Al | Y | Si | Ge | O | N | Eu |
|---|---|---|---|---|---|---|---|---|---|---|---|---|
| Example 13 | 0.445 | 0.542 | 0 | 0.005 | 0 | 1 | 0 | 0.998 | 0.002 | 0.016 | 2.992 | 0.008 |
| Example 14 | 0.435 | 0.542 | 0.005 | 0.005 | 0.005 | 1 | 0 | 1 | 0 | 0.022 | 2.991 | 0.008 |

TABLE 1-A

|  | Av. particle diameter (μm) | Mg, Ba content (ppm) | | Dominant wavelength of emitted light (nm) | Color coordinates | | Brightness (%) |
|---|---|---|---|---|---|---|---|
|  |  | Mg | Ba |  | x | y |  |
| Comparative Example 1 | 4.7 | 10 | 25 | 636 | 0.652 | 0.345 | 100 |
| Example 1 | 4.6 | 76 | 25 | 636 | 0.652 | 0.345 | 103 |
| Example 2 | 4.8 | 149 | 25 | 636 | 0.652 | 0.345 | 105 |
| Example 3 | 4.9 | 10 | 106 | 636 | 0.652 | 0.345 | 106 |
| Example 4 | 5.1 | 165 | 1551 | 636 | 0.651 | 0.345 | 108 |
| Example 5 | 5.1 | 318 | 26 | 635 | 0.650 | 0.347 | 106 |

TABLE 2-A

|  | Av. particle diameter (μm) | Mg, Ba content (ppm) | | Dominant wavelength of emitted light (nm) | Color coordinates | | Brightness (%) |
|---|---|---|---|---|---|---|---|
|  |  | Mg | Ba |  | x | y |  |
| Comparative Example 2 | 8.8 | 4 | 33 | 616 | 0.633 | 0.365 | 160 |
| Example 6 | 8.5 | 503 | 33 | 616 | 0.633 | 0.365 | 178 |
| Example 7 | 8.6 | 4 | 3740 | 616 | 0.633 | 0.366 | 176 |
| Example 8 | 9.1 | 973 | 511 | 616 | 0.633 | 0.365 | 185 |

TABLE 3-A

|  | Av. particle diameter (μm) | Mg, Ba content (ppm) | | Dominant wavelength of emitted light (nm) | Color coordinates | | Brightness (%) |
|---|---|---|---|---|---|---|---|
|  |  | Mg | Ba |  | x | y |  |
| Comparative Example 3 | 5.0 | 15 | 10 | 638 | 0.672 | 0.326 | 80 |
| Example 9 | 4.7 | 1237 | 4620 | 638 | 0.672 | 0.326 | 92 |

TABLE 4-A

|  | Av. particle diameter (μm) | Mg, Ba content (ppm) | | Dominant wavelength of emitted light (nm) | Color coordinates | | Brightness (%) |
|---|---|---|---|---|---|---|---|
|  |  | Mg | Ba |  | x | y |  |
| Comparative Example 4 | 9.0 | 3493 | 32 | 613 | 0.630 | 0.368 | 169 |
| Comparative Example 5 | 8.8 | 3 | 34 | 613 | 0.630 | 0.368 | 175 |
| Example 10 | 8.7 | 236 | 34 | 613 | 0.630 | 0.368 | 197 |
| Comparative Example 6 | 9.2 | 2 | 9024 | 608 | 0.631 | 0.370 | 171 |

TABLE 4-A-continued

|  | Av. particle diameter (μm) | Mg, Ba content (ppm) | | Dominant wavelength of emitted light (nm) | Color coordinates | | Brightness (%) |
| --- | --- | --- | --- | --- | --- | --- | --- |
|  |  | Mg | Ba |  | x | y |  |
| Comparative Example 7 | 8.8 | 3 | 36 | 608 | 0.631 | 0.370 | 181 |
| Example 11 | 8.9 | 3 | 279 | 608 | 0.631 | 0.370 | 205 |

TABLE 5-A

|  | Av. particle diameter (μm) | Mg, Ba content (ppm) | | Dominant wavelength of emitted light (nm) | Color coordinates | | Brightness (%) |
| --- | --- | --- | --- | --- | --- | --- | --- |
|  |  | Mg | Ba |  | x | y |  |
| Comparative Example 8 | 5.0 | 97 | 1 | 640 | 0.665 | 0.328 | 65 |
| Comparative Example 9 | 5.5 | 4 | 41 | 596 | 0.596 | 0.390 | 60 |
| Comparative Example 10 | 4.7 | 12 | 28 | 636 | 0.652 | 0.345 | 102 |
| Example 12 | 4.5 | 80 | 28 | 636 | 0.652 | 0.345 | 105 |
| Comparative Example 11 | 4.8 | 12 | 27 | 636 | 0.652 | 0.345 | 103 |
| Example 13 | 4.6 | 18 | 266 | 636 | 0.652 | 0.345 | 107 |
| Example 14 | 4.9 | 85 | 269 | 636 | 0.652 | 0.345 | 108 |

TABLE 6A

|  | Av. particle diameter (μm) | Mg, Ba content (ppm) | | Dominant wavelength of emitted light (nm) | Color coordinates | | Brightness (%) |
| --- | --- | --- | --- | --- | --- | --- | --- |
|  |  | Mg | Ba |  | x | y |  |
| Comparative Example 10 | 4.7 | 12 | 28 | 636 | 0.652 | 0.345 | 102 |
| Example 12 | 4.5 | 80 | 28 | 636 | 0.652 | 0.345 | 105 |
| Comparative Example 11 | 4.8 | 12 | 27 | 636 | 0.652 | 0.345 | 103 |
| Example 13 | 4.6 | 18 | 266 | 636 | 0.652 | 0.345 | 107 |
| Example 14 | 4.9 | 85 | 269 | 636 | 0.652 | 0.345 | 108 |

Brightness of the phosphor of the present invention is measured by means of a brightness measuring device. Referring to FIG. 1, which shows a brightness measuring device comprising a black box 11, a sample holder 12, a light source 13, a light guide tube 14, a reflector 15 and a brightness meter 16, in which the sample holder 12 is disposed in the box 11, and the light source 13 is perpendicularly disposed approximately 5 centimeters high above the sample holder 12. Diameter of the light guide tube 14 is approximately 2 centimeters, and is disposed so as to form a 45° angle to the light source 13. The reflector 15 is disposed within the light guide tube 14, and is positioned at a distance approximately 8 centimeters from the sample holder 12. Moreover, the distance between the brightness meter 16 and the reflector 15 is approximately 40 centimeters. After the phosphor disposed in the sample holder 12 is illuminated by the light source 13, then the light guide tube 14 and the reflector 15 horizontally guide the fluorescent light emitted from the phosphor into the brightness meter 16 for brightness measurements to be carried out.

More specifically, for each of the aforementioned Examples and Comparative Examples of the present invention, brightness measurement of the phosphor is carried out by taking 1.3 grams of the sample under test and placing it into the sample holder 12, the sample is then flattened to be uniformly distributed in the sample holder 12. The sample holder 12 is then placed within the box 11, and the light source 13 emitting a wavelength of 455 nm is used to vertically illuminate the sample. Moreover, the brightness meter 16 (manufactured by TOPCON, model No. SR-3A) uses field 1° detection mode to detect the fluorescent brightness.

Furthermore, the dominant wavelength of the luminescence spectrum of the phosphor refers to the wavelength of greatest luminous intensity.

Manufacture of the light emitting device of the present invention is completed in virtue of carrying out encapsulation of the phosphor of the aforementioned Examples and the semiconductor light-emitting element.

Figure 2:
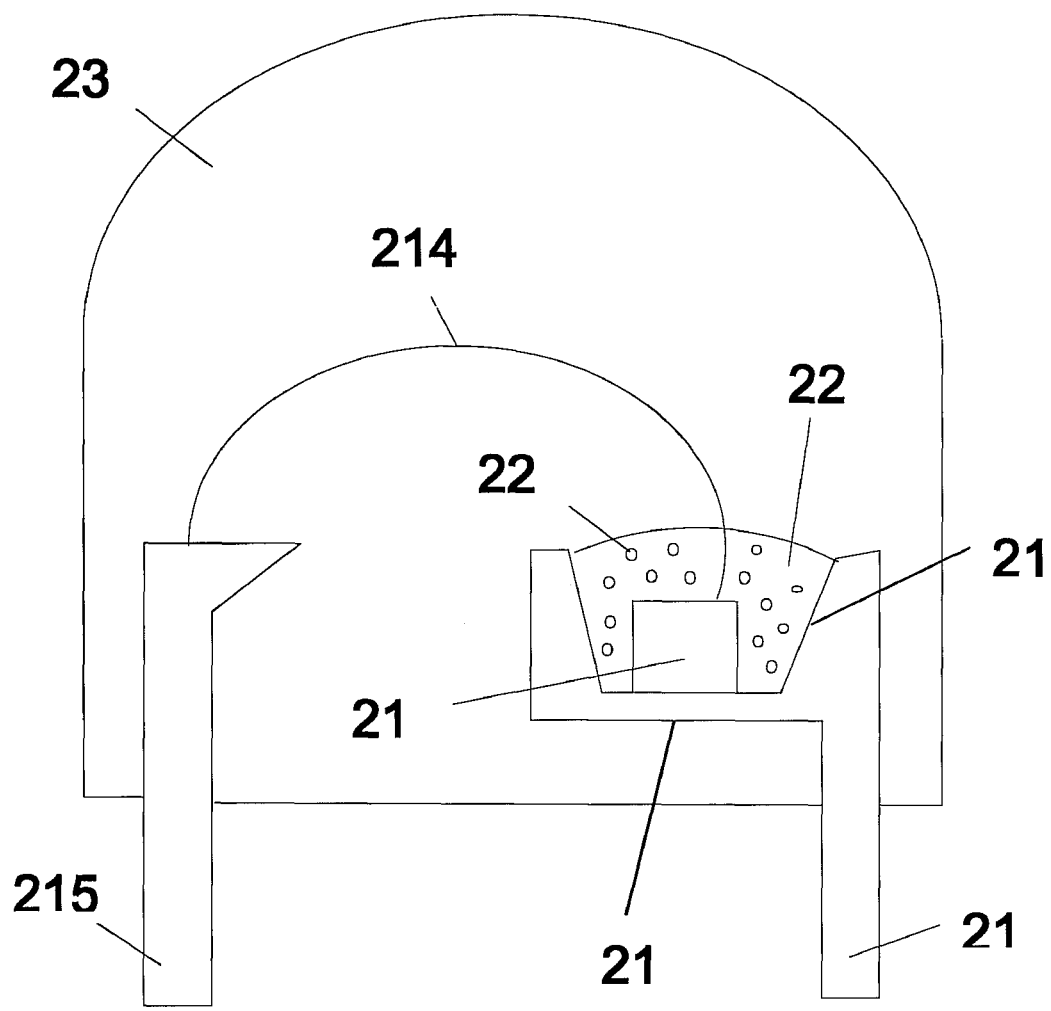
FIG. 2 is a cross-section schematic view of an embodiment depicting a light emitting device of the present invention.

Referring to FIG. 2, which shows an embodiment of the light emitting device of the present invention comprising a semiconductor light-emitting element 21, a luminescent layer 22 and an encapsulation layer 23. In which the semiconductor light-emitting element 21, comprising a base 211, is used to conduct electricity and provided with a loading end 212 that assumes a concave form, a light-emitting diode 213 is disposed in the concave loading end 212 and electrically is connected to the base 211, a connecting wire 214 is electrically connected to the light-emitting diode 213, and a conducting wire 215 is electrically connected to the connecting wire 214. In which the base 211 and the conducting wire 215 is used to transmit externally provided electrical energy to the light-emitting diode 213. The light-emitting diode 213 is used to receive the electrical energy and convert the energy into output light. The embodiment of the present invention bonds the commercially available InGaN blue light-emitting diode 213 with light emitting wavelength of 455 nm (manufacturer: Chimei Lighting Technology) to the loading end 212 of the base 211 in virtue of electric conductive silver paste (model: BQ6886, manufacturer: UNINWELL). Then, the connecting wire 214 electrically connected to the light-emitting diode 213 and with the conducting wire 215 are made to extend from the top end of the light-emitting diode 213.

The aforementioned luminescent layer 22 covers the light-emitting diode 213. The phosphor 221 contained in the luminescent layer 22 is excited by the light provided from the light-emitting diode 213, and converts to emit light different from the excited light wavelength. In this embodiment, the luminescent layer 22 is formed by coating silicone resin containing 35% by weight of the phosphor 221 on the outer surface of the light-emitting diode 213 and dried, hardened.

The encapsulation layer 23 covers the portions of the semiconductor light-emitting element 21, including base 211, the connecting wire 214, a portion of the conducting wire 215 and the luminescent layer 22.

In conclusion, the present invention is achieved by adjusting a proportion of each of the elements of the phosphor, and in combination with controlling the magnesium content to 20~1500 ppm and/or barium content to 40~5000 ppm in the phosphor, so as to obtain a phosphor emitting visible light with a dominant wavelength of 600~680 nm. Moreover, the phosphor in combination with a semiconductor light-emitting element enables obtaining a light emitting device of high brilliance.

It is of course to be understood that the embodiment and Examples described herein are merely illustrative of the principles of the invention and that a wide variety of modifications thereto may be effected by persons skilled in the art without departing from the spirit and scope of the invention as set forth in the following claims.

What is claimed is:

1. A phosphor, comprising a constituent having the formula $Ca_pSr_qM_m\text{-}A_a\text{-}B_b\text{—}O_t\text{—}N_n:Eu_r$, wherein M selected from the group consisting of beryllium and zinc, A selected from the group consisting of aluminum, gallium, indium, scandium, yttrium, lanthanum, gadolinium and lutetium, B selected from the group consisting of silicon, germanium, tin, titanium, zirconium and hafnium, $0<p<1$, $0<q<1$, $0\leq m<1$, $0\leq t\leq 0.3$, $0.00001\leq r\leq 0.1$, $a=1$, $0.8\leq b\leq 1.2$, and $2.7\leq n\leq 3.1$, and the phosphor contains 20~1500 ppm of magnesium and 40~5000 ppm of barium.

2. The phosphor according to claim 1, wherein the phosphor contains 85~1000 ppm of magnesium and 80~3000 ppm of barium.

3. The phosphor according to claim 1, wherein $0.05\leq p\leq 0.9$, $0.1\leq q\leq 0.95$.

4. The phosphor according to claim 3, wherein $0.15\leq (p+q)<1$.

5. The phosphor according to claim 1, wherein $(p/q)=0.1\text{~}10$.

6. The phosphor according to claim 1, wherein each of the content of the fluorine, boron, chlorine, and carbon in the phosphor is below 1000 ppm.

7. The phosphor according to claim 1, wherein
m=0;
A selected from the group consisting of aluminum and gallium;
B selected from the group consisting of silicon and germanium.

8. The phosphor according to claim 1, wherein the phosphor emits a visible light with dominant wavelength of 600~680 nm when excited by light in wavelength of 455 nm; wherein the color coordinates (x, y) of the visible light base on CIE 1931 chromaticity diagram are within $0.45\leq x\leq 0.72$, $0.2\leq y\leq 0.5$.

9. The phosphor according to claim 1, wherein average particle diameter of the phosphor is above 1 μm and below 30 μm.

10. A light emitting device, comprising:
a semiconductor light-emitting element for providing light in a first dominant wavelength; and
a phosphor, comprising a constituent having the formula $Ca_pSr_qM_m\text{-}A_a\text{-}B_b\text{—}O_t\text{—}N_n:Eu_r$, wherein M selected from the group consisting of beryllium and zinc, A selected from the group consisting of aluminum, gallium, indium, scandium, yttrium, lanthanum, gadolinium and lutetium; B selected from the group consisting of silicon, germanium, tin, titanium, zirconium and hafnium, p, q, m, a, b, t, n, r satisfy the following relationships of $0<p<1$, $0<q<1$, $0\leq m<1$, $0\leq t\leq 0.3$, $0.00001\leq r\leq 0.1$, $a=1$, $0.8\leq b\leq 1.2$, and $2.7\leq n\leq 3.1$, and the phosphor contains 20~1500 ppm of magnesium and 40~5000 ppm of barium; wherein the phosphor emits light with a second dominant wavelength different from the first dominant wavelength when excited by the light produced from the semiconductor light-emitting element.

11. The light emitting device according to claim 10, wherein the 300~550 nm.

12. The light emitting device according to claim 10, wherein the phosphor contains 85~1000 ppm of magnesium and 80~3000 ppm of barium.

13. The light emitting device according to claim 10, wherein $0.05\leq p\leq 0.9$, $0.1\leq q\leq 0.95$.

14. The light emitting device according to claim 13, wherein $0.15\leq (p+q)<1$.

15. The light emitting device according to claim 10, wherein $(p/q)=0.1\text{~}10$.

16. The light emitting device according to claim 10, wherein each of the content of the fluorine, boron, chlorine, and carbon in the phosphor is below 1000 ppm.

17. The light emitting device according to claim 10, wherein:
m=0;
A selected from the group consisting of aluminum and gallium;
B selected from the group consisting of silicon and germanium.

18. The light emitting device according to claim 10, wherein the phosphor is excited by light in wavelength of 455 nm and emits visible light with dominant wavelength of 600~680 nm and the color coordinates (x,y) of the visible light on CIE 1931 chromaticity diagram are $0.45\leq x\leq 0.72$, $0.2\leq y\leq 0.5$.

19. The light emitting device according to claim 10, wherein average particle diameter of the phosphor is above 1 μm and below 30 μm.

20. A phosphor, comprising a constituent having the formula $Ca_pSr_qM_m\text{-}A_a\text{-}B_b\text{—}O_t\text{—}N_n:Eu_r$, wherein M selected from the group consisting of beryllium and zinc, A selected from the group consisting of aluminum, gallium, indium, scandium, yttrium, lanthanum, gadolinium and lutetium, B selected from the group consisting of silicon, germanium, tin, titanium, zirconium and hafnium, p, q, m, a, b, t, n, r satisfy the following relationships of $0<p<1$, $0<q<1$, $0\leq m<1$, $0\leq t\leq 0.3$, $0.00001\leq r\leq 0.1$, $a\to 1$, $0.8\leq b\leq 1.2$, and $2.7\leq n\leq 3.1$, and the phosphor contains 20~1500 ppm of magnesium.

21. The phosphor according to claim 20, wherein the phosphor contains 85~1000 ppm of magnesium and 80~3000 ppm of barium.

22. The phosphor according to claim 20, wherein $0.05\leq p\leq 0.9$, $0.1\leq q\leq 0.95$.

23. The phosphor according to claim 22, wherein $0.15\leq (p+q)<1$.

24. The phosphor according to claim 20, wherein $(p/q)=0.1\sim 10$.

25. The phosphor according to claim 20, wherein each of the content of the fluorine, boron, chlorine, and carbon in the phosphor is below 1000 ppm.

26. The phosphor according to claim 20, wherein
m=0;
A selected from the group consisting of aluminum and gallium;
B selected from the group consisting of silicon and germanium.

27. The phosphor according to claim 20, wherein the phosphor emits a visible light with dominant wavelength of 600~680 nm when excited by light in wavelength of 45 nm;
wherein the color coordinates (x,y) of the visible light base on CIE 1931 chromaticity diagram are within $0.45\leq x\leq 0.72$, $0.2\leq y\leq 0.5$.

28. The phosphor according to claim 20, wherein average particle diameter of the phosphor is above 1 μm and below 30 μm.

29. A phosphor, comprising a constituent having the formula $Ca_pSr_qM_n\text{-}A_a\text{-}B_b\text{—}O_t\text{—}N_n:Eu_r$, wherein M selected from the group consisting of beryllium and zinc, A selected from the group consisting of aluminum, gallium, indium, scandium, yttrium, lanthanum, gadolinium and lutetium, B selected from the group consisting of silicon, germanium, tin, titanium, zirconium and hafnium, p, q, m, a, b, t, n, r satisfy the following relationships of $0<p<1$, $0<q<1$, $0\leq m\leq 1$, $0\leq t\leq 0.3$, $0.00001\leq r\leq 0.1$, $a=1$, $0.8\leq b\leq 1.2$, and $2.7\leq n\leq 3.1$, and the phosphor contains 40~5000 ppm of barium.

30. The phosphor according to claim 29, wherein the phosphor contains 85~1000 ppm of magnesium and 80~3000 ppm of barium.

31. The phosphor according to claim 29, wherein $0.05\leq p\leq 0.9$, $0.1\leq q\leq 0.95$.

32. The phosphor according to claim 31, wherein $0.15\leq (p+q)<1$.

33. The phosphor according to claim 29, wherein $(p/q)=0.1\sim 10$.

34. The phosphor according to claim 29, wherein each of the content of the fluorine, boron, chlorine, and carbon in the phosphor is below 1000 ppm.

35. The phosphor according to claim 29, wherein
m=0;
A selected from the group consisting of aluminum and gallium;
B selected from the group consisting of silicon and germanium.

36. The phosphor according to claim 29, wherein the phosphor emits a visible light with dominant wavelength of 600~680 nm when excited by light in wavelength of 455 nm;
wherein the color coordinates (x,y) of the visible light base on CIE 1931 chromaticity diagram are within $0.45\leq x\leq 0.72$, $0.2\leq y\leq 0.5$.

37. The phosphor according to claim 29, wherein average particle diameter of the phosphor is above 1 μm and below 30 μm.

* * * * *